United States Patent [19]
Kojima et al.

[11] Patent Number: 5,929,451
[45] Date of Patent: Jul. 27, 1999

[54] SYMMETRIC MAGNETIC DOUBLET FOR CHARGED PARTICLE BEAM LITHOGRAPHY

[75] Inventors: Shin-Ichi Kojima, Kawasaki; Kazuya Okamoto, Yokohama, both of Japan

[73] Assignee: Nikon Corporation, Tokyo, Japan

[21] Appl. No.: 09/041,977

[22] Filed: Mar. 13, 1998

[30] Foreign Application Priority Data

Mar. 13, 1997 [JP] Japan ................................ 9-059070

[51] Int. Cl.$^6$ .................................................. H01J 37/30
[52] U.S. Cl. ................................................ 250/396 ML
[58] Field of Search ........................ 250/396 ML, 396 R

[56] References Cited

U.S. PATENT DOCUMENTS 5,773,837  6/1998  Nakasuji ........................ 250/396 ML

OTHER PUBLICATIONS

Heritage, "Electron–Projection Microfabrication System," *J. Vac. Sci. Technol.*, vol. 12, No. 6, pp. 1135–1140 (Nov./Dec. 1975).

*Primary Examiner*—Kiet T. Nguyen
*Attorney, Agent, or Firm*—Klarquist Sparkman Campbell Leigh & Whinston, LLP

[57] ABSTRACT

Symmetric magnetic doublets are disclosed that image a reticle onto a sensitized substrate using a charged-particle beam. The symmetric magnetic doublet comprises an object-side lens and an image-side lens and satisfies certain quantitative conditions. If the object-side lens has a length $S_1$ and pole-piece apertures of radii $R_1$, $R_2$, and the image-side lens has a length $S_2$ and pole-piece apertures of radii $R_3$, $R_4$, then a lens according to an embodiment of the invention produces a demagnification of $1/m$ in an object-image distance L between the reticle and the substrate. This embodiment satisfies the relations $R_3=R_2/m$, $R_4=R_1/m$, $S_2=S_1/m$, and $$L\left[1 - \frac{1}{(m-0.5)}\right] \le S_1 \le L\left[1 - \frac{1}{(m+1)}\right].$$

13 Claims, 5 Drawing Sheets

SYMMETRIC MAGNETIC DOUBLET FOR CHARGED PARTICLE BEAM LITHOGRAPHY

FIELD OF THE INVENTION

The invention pertains to magnetic lenses for charged-particle-beam lithography.

BACKGROUND OF THE INVENTION

Charged-particle-beam pattern-transfer apparatus use a charged-particle beam, such as an electron beam, to project a pattern from a reticle or mask onto a wafer. In such apparatus, a rotationally-symmetric magnetic lens typically images the reticle onto the wafer. This lens must produce clear, undistorted images. One satisfactory lens type is a magnetic doublet having two magnetic lenses that produce opposite magnetic fields.

The trajectory of a charged particle in a charged-particle optical system is usually described in terms of a paraxial trajectory and aberrations. In a rotationally symmetric electric or magnetic field, the trajectory of a charged particle is calculated based on the coordinates $(x_0, y_0)$ and propagation angles $(\alpha_1, \alpha_2)$ of the particle at the wafer plane. The aberrations of the optical system are expressed in terms of polynomials of order $2n+1$, where $n \geq 1$. Terms of order $2n+1$ represent the $(2n+1)$th order aberrations.

While most aberrations are represented by terms of order 3 or higher, chromatic aberration effects even the paraxial trajectory. Chromatic aberration is caused by the spread of charged particle energies in the charged particle beam and chromatic aberration therefore occurs at orders of $(2n-1)$ or larger, where $n \geq 1$.

If the charged particle trajectory is expressed in terms of the complex coordinates $w = x + iy$, the total third-order geometric aberration as a function of the complex coordinate $\beta = x_0 + iy_0$ and the complex propagation angle $\alpha = \alpha_1 + i\alpha_2$ at the wafer is given by:

$$W_3 = K_{sph}\alpha^2\alpha^* + K_{coma-l}\alpha\alpha^*\beta + K_{coma-r}\alpha^2\beta^* + \qquad (1)$$
$$K_{fc}\alpha\beta\beta^* + K_{astig}\alpha^*\beta^2 + K_{dis}\beta^2\beta^* +$$
$$K_{t-chro}\beta\Delta V/V + K_{a-chro}\alpha\Delta V/V$$

wherein $\alpha^*$ and $\beta^*$ are the complex conjugates of $\alpha$ and $\beta$ respectively, V is the accelerating voltage and $\Delta V$ is the charged-particle-beam energy spread. The various aberration coefficients are $K_{sph}$ (spherical aberration), $K_{coma-l}$ (longitudinal coma), $K_{coma-r}$ (transverse or radial coma), $K_{fc}$ (field curvature), $K_{astig}$ (astigmatism), $K_{dis}$ (distortion), $K_{t-chro}$ (transverse chromatic aberration), and $K_{a-chro}$ (axial chromatic aberration).

In a magnetic doublet, distortion, chromatic aberration, and image rotation generated by a first lens offset distortion, chromatic aberration, and image rotation produced by a second lens. For this reason, the transverse chromatic aberration coefficient $K_{t-chro}$ and the distortion coefficient $K_{dis}$ are zero. However, the magnetic doublet exhibits other types of aberrations that depend upon fields produced by the lens.

In charged-particle-beam pattern-transfer apparatus, image blur caused by Coulomb interactions of the charged particles in the beam limits throughput. In order to reduce this image blur, the beam current density is reduced. One method of decreasing current density without decreasing throughput is to irradiate a large area of the reticle with a large diameter beam. Increasing the beam numerical aperture also reduces image blur due to Coulomb interactions.

The aberrations of the magnetic doublet are not determined solely by the aberrations of the individual lenses of the doublet, and optimization of the individual lenses does not ensure optimization of the doublet. In addition, the actual aberrations realized during use depend upon the propagation direction of the beam and location of the beam on the reticle. For example, if the reticle is demagnified with a demagnification $1/m$ onto the wafer, then the initial coordinate of the beam is $m\beta$ at the reticle. If the initial coordinate of the beam is increased (i.e., the beam propagates farther off-axis), then the aberrations are changed according to Equation 1. For this reason, lens-system design calculations are complex and it is difficult to optimize such lenses.

Therefore, it is an object of the invention to reduce the blur associated with geometric aberrations and Coulomb interactions.

SUMMARY OF THE INVENTION

In one embodiment of the invention, a magnetic lens system for forming an image of an object irradiated by a charged-particle beam is provided. The object is typically a reticle and the image of the reticle is generally formed on a surface of a sensitized substrate, such as a semiconductor wafer coated with a resist that is sensitive to a charged-particle beam. The magnetic lens system comprises an object-side lens system of length $S_1$ and having an object-side aperture of radius $R_1$ and an image-side aperture of radius $R_2$, and an image-side lens system of length $S_2$ having an object-side aperture of radius $R_3$ and an image-side aperture of radius $R_4$. The image is demagnified by $1/m$ and the magnetic lens system satisfies the doublet symmetry conditions:

$$R_3 = R_2/m,$$
$$R_4 = R_1/m,$$
$$S_2 = S_1/m,$$

and $$|z_2 - z_i|m = |z_1 - z_o|,$$

wherein the object and the image are positioned along an axis at coordinates $z_o$ and $z_i$, respectively, the object-side lens system and the image-side lens system are positioned along the axis at coordinates $z_1$ and $Z_2$, respectively, and L is the distance between the image and the object and is given by $L = |z_i - z_o|$. Because the lens satisfies the doublet symmetry conditions, it is referred to as a symmetric magnetic doublet.

A magnetic lens according to an embodiment of the invention satisfies an additional condition:

$$L\left[1 - \frac{1}{(m - 0.5)}\right] \leq S_1 \leq L\left[1 - \frac{1}{(m + 1)}\right].$$

Another embodiment comprises a magnetic lens system that satisfies a further additional condition:

$$0.05 \leq \frac{R_1}{L} \leq 0.25.$$

In a further embodiment of the invention, the distance L=400 mm.

Yet another embodiment of the invention comprises a magnetic lens system satisfying the doublet symmetry conditions and the condition:

$$L\left[1 - \frac{1}{(m - 0.5)}\right] \leq S_1 \leq L\left[1 - \frac{1}{(m + 1)}\right]$$

wherein L=400 mm is the distance between the object and the image

Still another embodiment of the invention comprises a magnetic lens system comprising an object-side lens system of length $S_1$ and having an object-side aperture of radius $R_1$ and an image-side aperture of radius $R_2$, and an image-side lens system of length $S_2$ having an object-side aperture of radius $R_3$ and an image-side aperture of radius $R_4$. The image-side lens system is displaced a distance $\Delta z$ toward the object-side lens system from the doublet-symmetry conditions that are satisfied if $\Delta z=0$:

$R_3=R_2/m$, $R_4=R_1/m$, $S_2=S_1/m$, and $|z_2-z_i|m=|z_1-z_o|$.

In another embodiment of the invention, the displacement $\Delta z$ satisfies the condition:

$$\Delta z = \left(\frac{L}{100}\right)\left(\frac{m}{m+1}\right).$$

Additional embodiments are provided in which the image-side lens system is displaced toward the object-side lens system by the distance $\Delta z$ and additional conditions are satisfied. In one of these embodiments, the distance L between the image and the object satisfies the condition:

$$L\left[1 - \frac{1}{(m - 0.5)}\right] \leq S_1 \leq L\left[1 - \frac{1}{(m + 1)}\right].$$

Alternatively, the magnetic lens satisfies the condition:

$$0.05 \leq \frac{R_1}{L} \leq 0.25.$$

In an example embodiment of the invention, the length $S_1$=300 mm, $R_1$=$R_2$=40 mm, and L=400 mm.

The foregoing and other features and advantages of the invention will become more apparent from the following detailed description of a preferred embodiment which proceeds with reference to the accompanying drawings.

DETAILED DESCRIPTION

Figure 1:
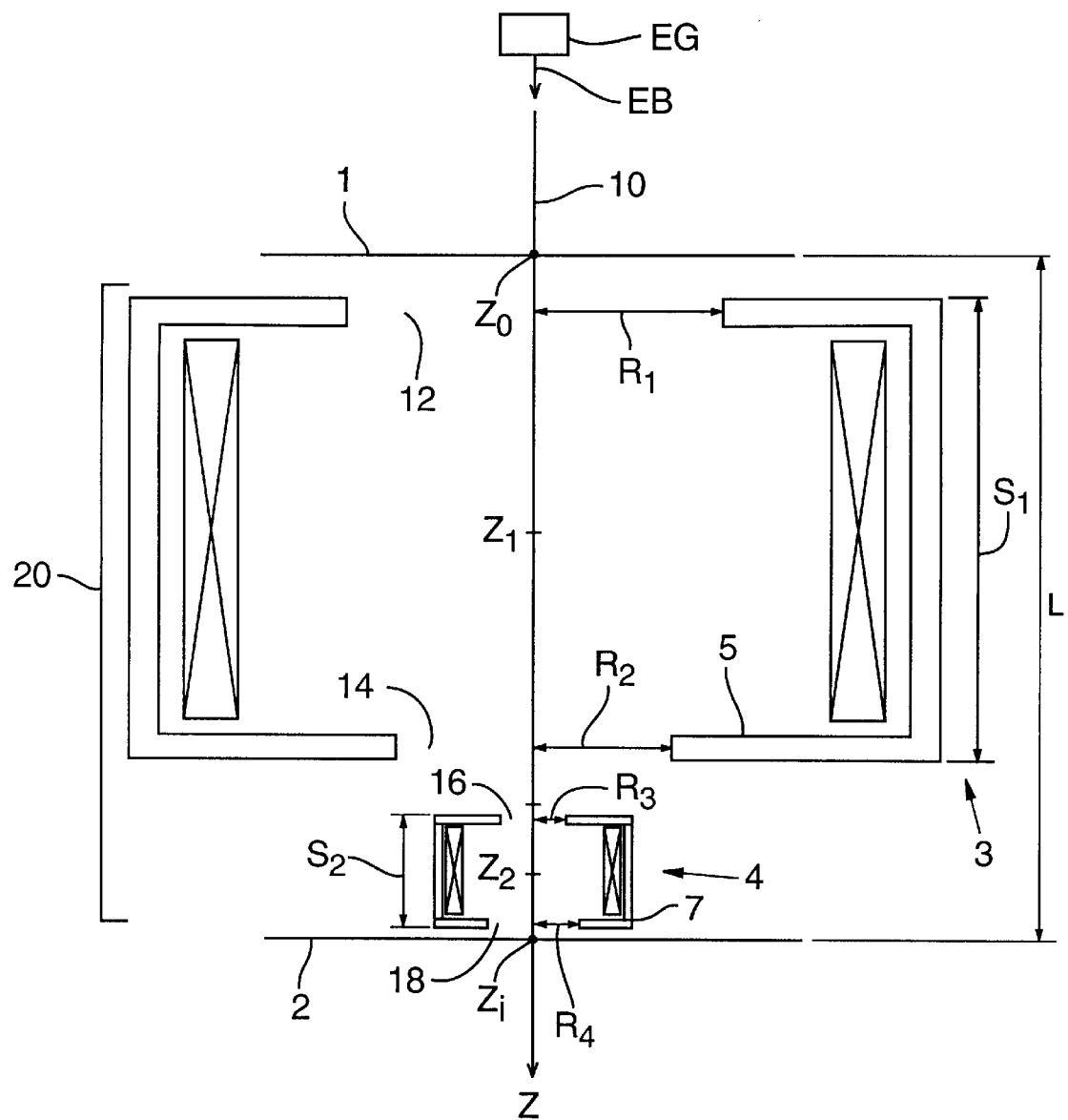
FIG. 1 is a sectional elevational view of an electron-beam optical system that images a reticle onto a substrate.

With reference to FIG. 1, a reticle 1 or other object is irradiated by an electron beam EB produced by an electron gun EG. The electron beam EB propagates along a z-axis 10 to a sensitized substrate 2 or other image plane. The sensitized substrate 2 is typically a semiconductor wafer coated with an electron-beam-sensitive resist. A symmetric magnetic doublet 20 comprising an object-side lens 3 and an image-side lens 4 images the reticle 1 onto the substrate 2 with a demagnification of 1/m. For convenience, locations are referred to as on an object side or an image side if closer to the reticle 1 or the sensitized substrate 2, respectively, as measured along the z-axis 10.

The reticle 1 and the substrate 2 are positioned along the z-axis at coordinates $z_0$ and $z_i$, respectively, and are separated from each other by a distance $L=|z_i-z_o|$. The object-side lens 3 and the image-side lens 4 are located along the z-axis 10 at coordinates $z_1$ and $Z_2$ and have lengths $S_1$ and $S_2$, respectively. A pole piece 5 of the object-side lens 3 has an object-side central aperture 12 of radius $R_1$ and an image-side central aperture 14 of radius $R_2$, respectively; the image-side lens 4 has a pole piece 7 having object side and image side apertures 16, 18 of radii $R_3$, $R_4$, respectively.

The lens 20 substantially satisfies the following conditions that are referred to herein as the "doublet-symmetry" conditions:

$R_3=R_1/m$, $R_4=R_2/m$, $S_2=S_1/m$, and $|z_2-z_i|m=|z_1-z_o|$.

A lens substantially satisfying these conditions is referred to as a "symmetric magnetic doublet."

For convenience, the performance of the lens 20 (satisfying the symmetric magnetic-doublet conditions) is described with reference to illustrative parametric values for the dimensions of the lenses 3, 4 and the properties of the electron beam EB. The illustrative values are the propagation angle $\alpha$=8 mrad, the coordinate $\beta$=0.5 mm, the accelerating voltage V=100 kV, the beam energy spread of 5 eV, and the object-image distance L=400 mm. The propagation angle $\alpha$ and the coordinate $\beta$ are measured at the image plane, i.e., at the sensitized substrate 2.

The symmetric magnetic doublet 20 is first evaluated at specified values of the lens dimensions. For purposes of illustration, the length $S_1$=300 mm and the radii $R_1$, $R_2$ of the pole piece 5 are $R_1$=$R_2$=40 mm. The total image blur produced by the lens 20 is estimated as 0.12 μm based on the square root of the sum of the squares of the third-order aberrations.

Figure 2:
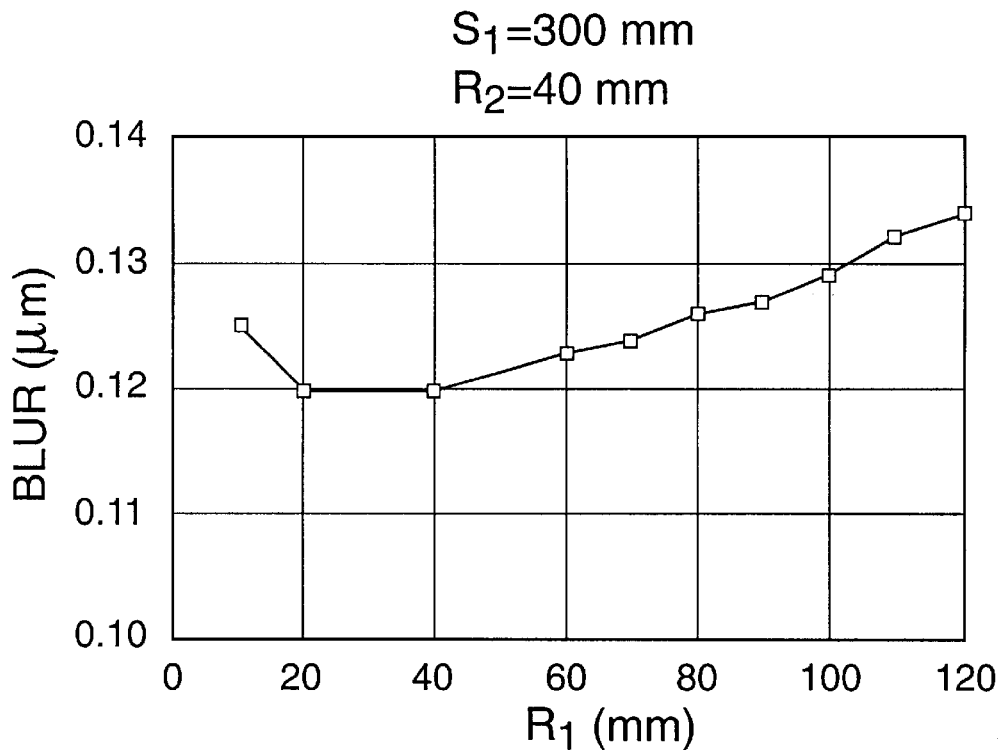
FIG. 2 is a graph of image blur as a function of $R_1$.

The parameters $R_1$, $R_2$, and $S_1$ can be varied while satisfying the doublet symmetry conditions. E.g., with reference to FIG. 2, the calculated image blur is graphed as a function of $R_1$ for $S_1$=300 mm and $R_2$=40 mm. The smallest image blur is about 0.12 μm and is obtained for 20 mm$\leq R_1 \leq$40 mm. For an image blur of this magnitude, the allowable image-blur tolerance is about 10% of the minimum image blur, so that the image blur is acceptable for 20 mm$\leq R_1 \leq$100 mm. The image blur is acceptably small for $R_1$ at least as small as 10 mm as is shown in FIG. 2. However, manufacture of the pole piece 7 becomes difficult if $R_1$ is small, so a minimum value of 20 mm for $R_1$ is selected to enable simple manufacture.

Figure 3:
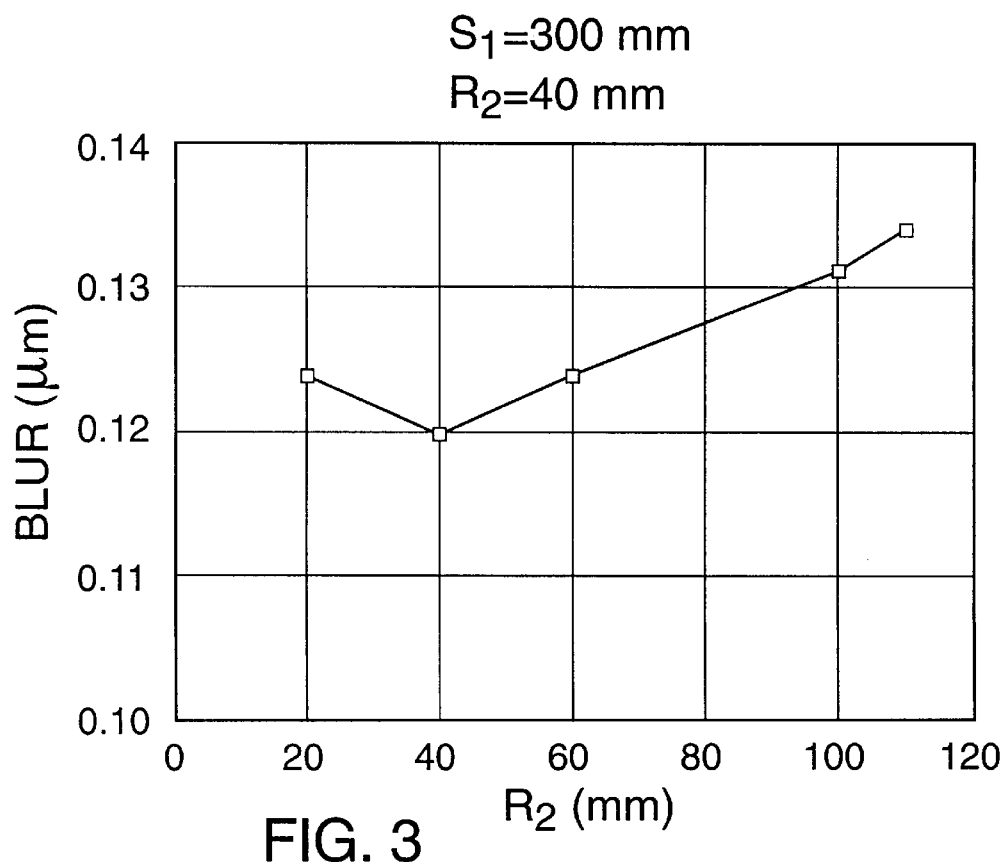
FIG. 3 is a graph of image blur as a function of $R_2$.

With reference to FIG. 3, image blur is graphed as a function of $R_2$ for $S_1$=300 mm and $R_1$=40 mm. The smallest value of calculated image blur is 0.12 $\mu$m and is obtained at $R_1$=40 mm. Allowing a 10% tolerance in the image blur, the acceptable range for $R_2$ is 20 mm$\leq R_2 \leq$100 mm. While the ranges for $R_1$ and $R_2$ obtained from FIGS. 2–3 are calculated for L=400 mm, small variations in L do not change the results.

The radii $R_1$, $R_2$ can be selected almost independently of the object-image distance L. Therefore, aberrations are reduced to acceptable levels with 20 mm$\leq R_1$, $R_2 \leq$100 mm for a wide range of values of the image-object distance L.

Figure 4:
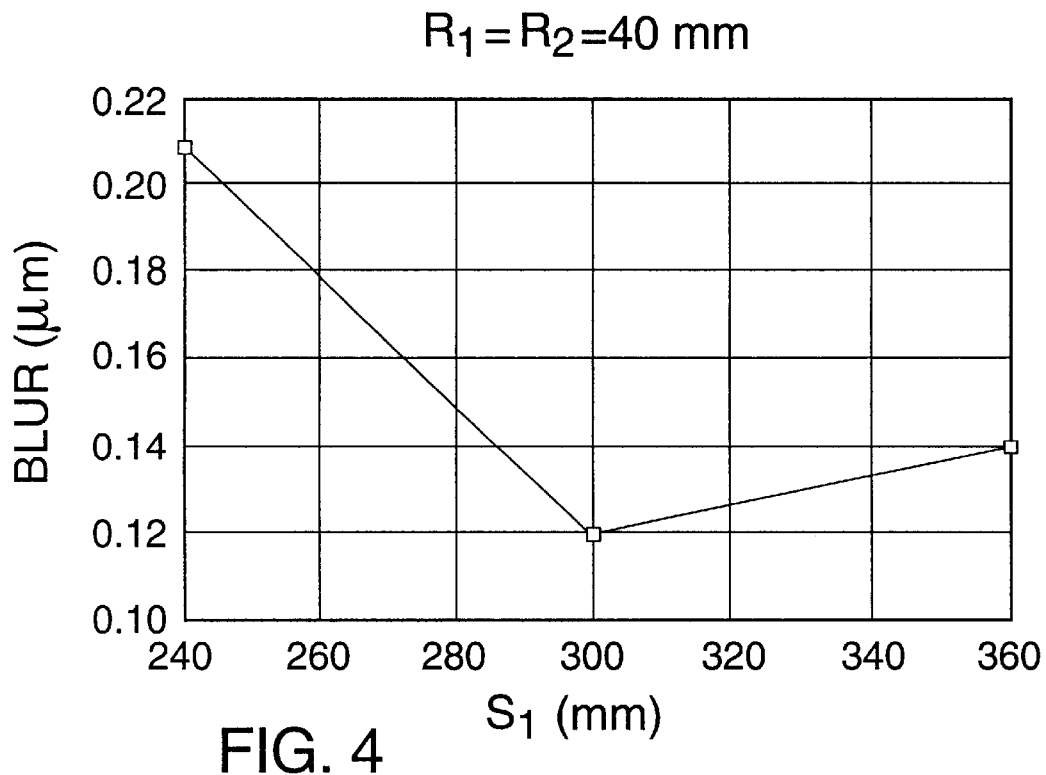
FIG. 4 is a graph of image blur as a function of lens length $S_1$.

With reference to FIG. 4, image blur is graphed as a function of the length $S_1$ of the lens 3 with $R_1$=$R_2$=40 mm. Although the blur is calculated for distances $S_1$ as large as S=360 mm, because the object-image distance L is fixed at 400 mm, the length $S_1$ must be less than 320 mm for an actual lens. The blur is minimized at $S_1$=300 mm with an approximate optimum range of 290 mm$\leq S_1 \leq$320 mm. In terms of the distance L and the magnification m, the distance $S_1$ satisfies the following condition:

$$\left| 1 - \frac{1}{(m-0.5)} \right| \leq S_1/L \leq \left| 1 - \frac{1}{(m+1)} \right|.$$

In these calculations, the lengths $S_1$, $S_2$ and the pole-piece-aperture radii $R_1$, $R_2$, $R_3$, $R_4$ are varied so that the doublet-symmetry conditions remain satisfied.

Figure 5:
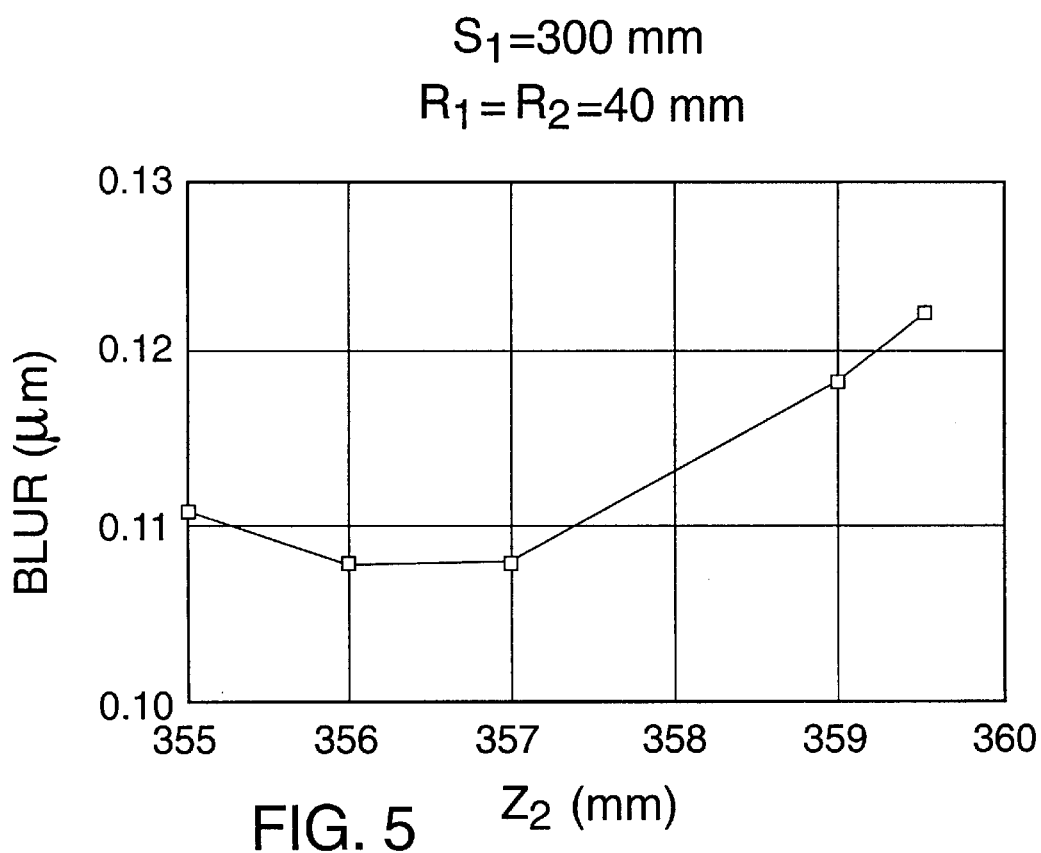
FIG. 5 is a graph of image blur as a function of the wafer-side lens position $Z_2$.

Image blurs have also been determined for configurations of the lenses 3, 4 that initially satisfy the doublet-symmetry conditions but in which the lens 4 is moved toward the lens 3 so that doublet-symmetry conditions are no longer satisfied. With reference to FIG. 5, the image blur is graphed as a function of the position $Z_2$ of the lens 4 for $S_1$=300 mm and $R_1$=$R_2$=40 mm. Values of $Z_2$ in the range 359–360 mm correspond to the location of the lens 4 satisfying double symmetric magnetic conditions. The image blur has a minimum value of about 0.108 $\mu$m for 356 mm$\leq Z_2 \leq$357 mm. This range can be expressed as a displacement $\Delta Z_2$ along the z-axis 10 from an initial position in which the doublet-symmetry conditions are satisfied. The displacement $\Delta Z_2$ of the lens 4 toward the lens 3 is given by:

$$\Delta z_2 = \left( \frac{L}{100} \right)\left( \frac{m}{m+1} \right),$$

wherein the doublet-symmetry conditions are satisfied if the displacement $\Delta Z_2$=0.

Figure 6:
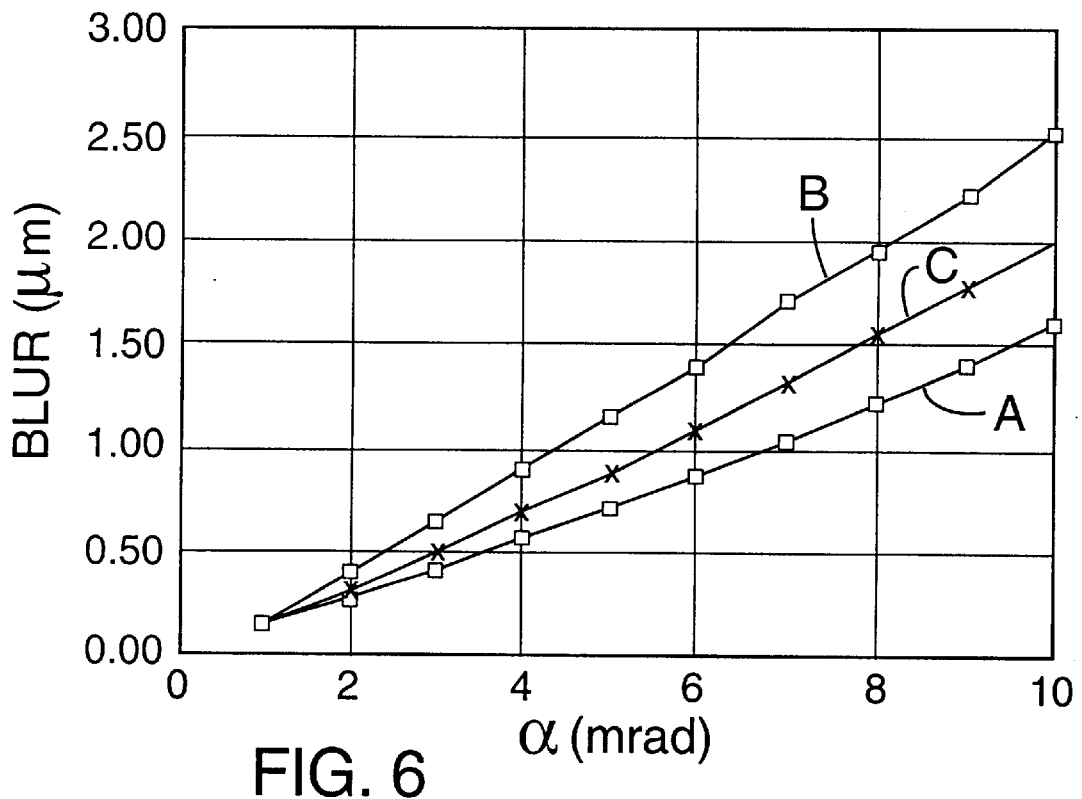
FIG. 6 is a graph of image blur as a function of the propagation angle $\alpha$.
Figure 7:
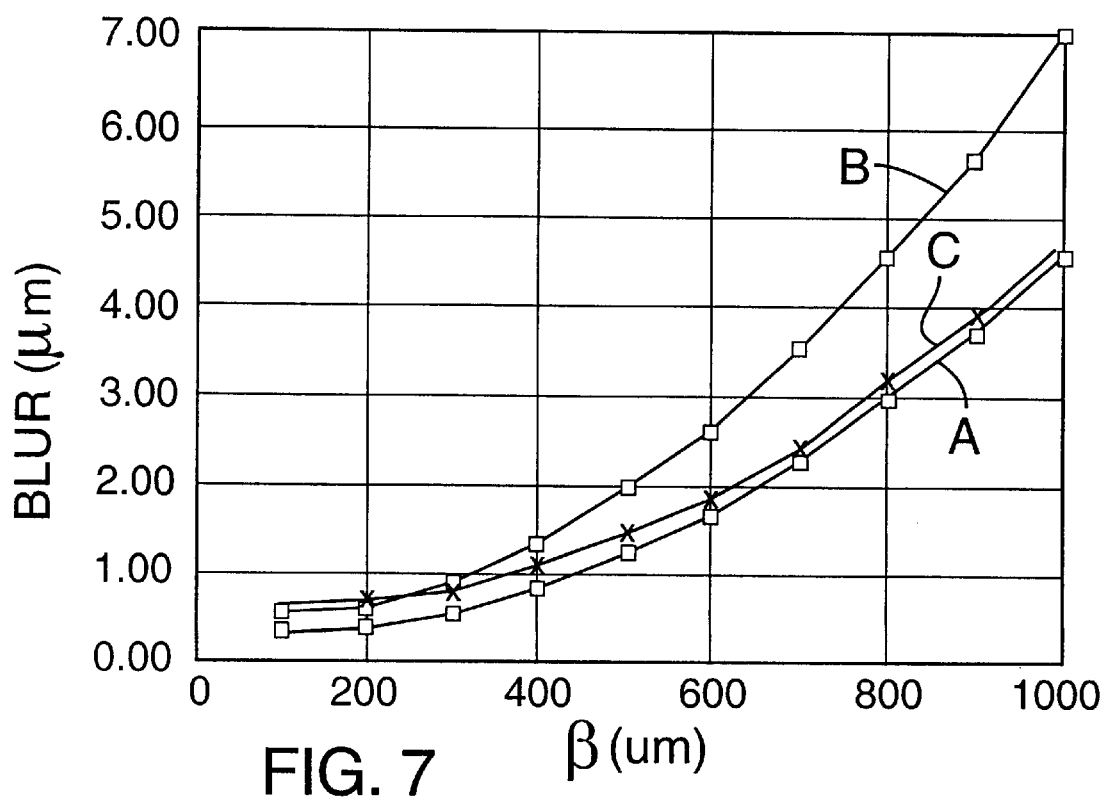
FIG. 7 is a graph of image blur as a function of the coordinate $\beta$.

The blurs of FIGS. 2–5 are calculated for a fixed propagation angle $\alpha$ and coordinate $\beta$ at the sensitized substrate 2. The blurs result mainly from third-order geometric aberrations. FIGS. 6–7 display image blur as a function of the propagation angle $\alpha$ and the coordinate $\beta$, respectively. In FIG. 6, the image blur for the coordinate $\beta$=0.5 mm is graphed as a function of the propagation angle $\alpha$. In FIG. 7, the image blur for a propagation angle $\alpha$=8 mrad is graphed as a function of the coordinate $\beta$. The blurs of FIGS. 6–7 are calculated for $R_1$=$R_2$=40 mm and $S_1$=300 mm, 240 mm, 360 mm, corresponding to curves A, B, C, respectively. The image blur is smallest for $S_1$=300 mm and the minimum values of $\alpha$ and $\beta$. In addition, the image blur is smaller for $S_1$=300 mm than $S_1$=240 mm or $S_1$=360 mm for all values of the propagation angle $\alpha$ and coordinate $\beta$.

Figure 8:
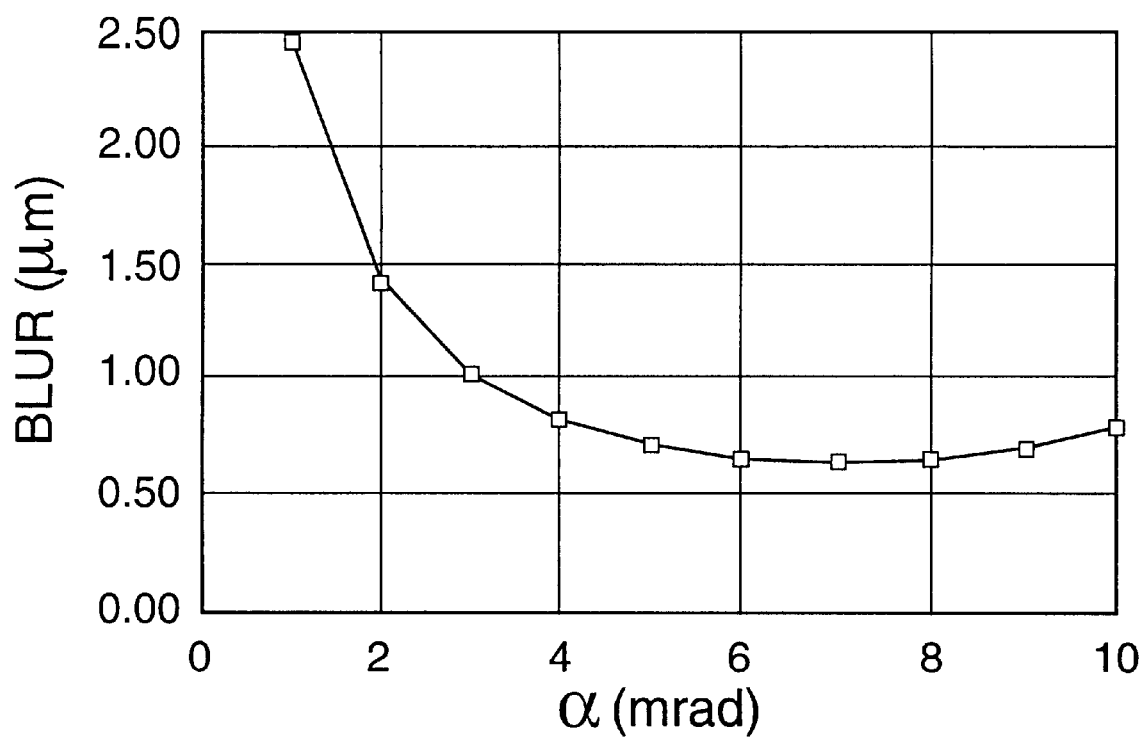
FIG. 8 is a graph of image blur as a function of the propagation angle $\alpha$, including image blur caused by Coulomb interactions.

Geometric aberrations of the lenses 3, 4 cause the image blurs of FIGS. 2–7. An additional aberration is caused by Coulomb interactions of the electrons in the electron beam EB. This aberration is conveniently calculated using a Monte Carlo simulation. The calculated total blur is then the square root of the sum of the squares of the blurs due to Coulomb interactions and the geometric aberrations. The calculations of the blur caused by Coulomb interactions of the electrons are illustrated with the lens parameters A of FIG. 6, a beam current of 25 $\mu$A, and a 250-$\mu$m square beam. FIG. 8 shows the calculated blur; the total blur is smallest at a propagation angle a of about 7 mrad and an acceptable range for the propagation angle $\alpha$ is 5.8 mrad$\leq \alpha \leq$8.0 mrad.

Lens systems for charged-particle beams are generally optimized by optimizing individual lenses. In contrast, the symmetric magnetic doublet is improved by optimizing the entire lens system, i.e., lenses 3, 4, simultaneously.

The lenses 3, 4 are illustrated in FIG. 1 as individual magnetic lenses, but can comprise lens systems having one or more lenses and are referred to as lens systems.

Having illustrated and demonstrated the principles of the invention in a preferred embodiment, it should be apparent to those skilled in the art that the preferred embodiment can be modified in arrangement and detail without departing from such principles. We claim as the invention all that comes within the scope of these claims.

What is claimed is:

1. A magnetic lens system for forming an image of an object irradiated by a charged particle beam, the image located at a coordinate $z_i$ along an axis and having a demagnification 1/m and the object located at a coordinate $z_o$ along the axis, the magnetic lens system comprising:

an object-side lens system of length $S_1$ and defining an object-side aperture of radius $R_1$ and an image-side aperture of radius $R_2$, the object-side lens system located along the axis at a coordinate $z_1$ and satisfying the condition:

$$L\left[ 1 - \frac{1}{(m-0.5)} \right] \leq S_1 \leq L\left[ 1 - \frac{1}{(m+1)} \right],$$

wherein the distance between the image and the object is L=$|z_o - z_i|$;

an image-side lens system of length $S_2$ defining an object side aperture of radius $R_3$ and an image side aperture of radius $R_4$, the image-side lens system located along the axis at a coordinate $z_2$; and the magnetic lens system satisfying the conditions:

$R_3$=$R_2$/m, $R_4$=$R_1$/m, $S_2$=$S_1$/m, and $|z_2 - z_i|$m~$|z_1 - z_o|$.

2. The magnetic lens system of claim 1, further satisfying the condition:

$$0.05 \le \frac{R_1}{L} \le 0.25.$$

3. The magnetic lens system of claim 2, wherein the distance L=400 mm.

4. The magnetic lens system of claim 1, wherein the distance L=400 mm.

5. A magnetic lens system for forming an image of an object irradiated by a charged particle beam, the image located at a coordinate $z_i$ along an axis and having a demagnification 1/m and the object located at a coordinate $z_o$ along the axis, the magnetic lens system comprising:

an object-side lens system of length $S_1$ and defining an object side aperture of radius $R_1$ and an image side aperture of radius $R_2$, the object-side lens system located at a coordinate $z_1$ along the axis;

an image-side lens system of length $S_2$ defining an object-side aperture of radius $R_3$ and an image-side aperture of radius $R_4$, the image-side lens located at a coordinate $Z_2$ along the axis and satisfying the conditions:

$R_3 = R_2/m,$ $R_4 = R_1/m,$ and $S_2 = S_1/m;$ and the image-side lens system being displaced a distance $\Delta z$ toward the object-side lens system from the condition:

$|z_2 - z_i| m = |z_1 - z_o|.$

6. The magnetic lens system of claim 5 wherein the distance L between the object and the image is $L = |z_i - z_o|$ and the distance $\Delta z$ is given by:

$$\Delta z = \left(\frac{L}{100}\right)\left(\frac{m}{m+1}\right).$$

7. The magnetic lens system of claim 6, satisfying the condition:

$$L\left[1 - \frac{1}{(m - 0.5)}\right] \le S_1 \le L\left[1 - \frac{1}{(m + 1)}\right].$$

8. The magnetic lens system of claim 7, further satisfying the condition:

$$0.05 \le \frac{R_1}{L} \le 0.25.$$

9. The magnetic lens system of claim 8, wherein the distance L=400 mm.

10. The magnetic lens system of claim 5, wherein the distance between the image and the object is $L = |z_i - z_o|$ and satisfying the condition:

$$L\left[1 - \frac{1}{(m - 0.5)}\right] \le S_1 \le L\left[1 - \frac{1}{(m + 1)}\right].$$

11. The magnetic lens system of claim 10, further satisfying the condition:

$$0.05 \le \frac{R_1}{L} \le 0.25.$$

12. The magnetic lens system of claim 11, wherein the distance L=400 mm.

13. The magnetic lens system of claim 5, wherein the distance between the image and the object is $L = |z_i - z_o|$ and satisfying the condition:

$$0.05 \le \frac{R_1}{L} \le 0.25.$$

* * * * *

UNITED STATES PATENT AND TRADEMARK OFFICE
CERTIFICATE OF CORRECTION

PATENT NO. : 5,929,451  
DATED : July 27, 1999  
INVENTOR(S) : Kojima et al.

Page 1 of 1

It is certified that error appears in the above-identified patent and that said Letters Patent is hereby corrected as shown below:

In the Claims:

Column 6,  
Line 64, "$|z_2 - z_i|$ m - $|z_1 - z_o|$" should be --$|z_2 - z_i|$ m = $|z_1 - z_o|$ --.

Signed and Sealed this

Thirty-first Day of July, 2001

*Attest:*

Nicholas P. Godici

*Attesting Officer*

NICHOLAS P. GODICI  
*Acting Director of the United States Patent and Trademark Office*